United States Patent
Hwang et al.

(10) Patent No.: US 7,473,571 B2
(45) Date of Patent: Jan. 6, 2009

(54) METHOD FOR MANUFACTURING VERTICALLY STRUCTURED LIGHT EMITTING DIODE

(75) Inventors: Hae Yeon Hwang, Kyungki-do (KR); Yung Ho Ryu, Seoul (KR); Da Mi Shim, Kyungki-do (KR); Se Hwan Ahn, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/541,674

(22) Filed: Oct. 3, 2006

(65) Prior Publication Data

US 2007/0077673 A1   Apr. 5, 2007

(30) Foreign Application Priority Data

Oct. 5, 2005   (KR) ...................... 10-2005-0093409

(51) Int. Cl.
*H01L 21/00* (2006.01)
(52) U.S. Cl. ................................. 438/46; 257/E33.006
(58) Field of Classification Search ................... 438/46, 438/22, 39, 37; 257/E33.006, E33.007, E33.068, 257/222, 290, 414
See application file for complete search history.

(56) References Cited

U.S. PATENT DOCUMENTS 6,071,795 A   6/2000   Cheung et al.

2004/0026370 A1* 2/2004 Lindner et al. ................ 216/65
2004/0235210 A1   11/2004 Tamura et al.
2005/0017253 A1   1/2005 Hata
2006/0231852 A1* 10/2006 Kususe et al. ................ 257/99

FOREIGN PATENT DOCUMENTS

| DE | 100 51 465 A1 | 5/2002 |
| KR | 10-2004-0058479 A | 7/2004 |
| KR | 2005-12188 | 1/2005 |

OTHER PUBLICATIONS

German Office Action, issued in Corresponding German Patent Application No. 10 2006 046 449.4-33, dated on Nov. 21, 2007.
Korean Office Action issued in corresponding Korean Patent Application No. KR 10-2005-0093409, dated Oct. 26, 2006.

* cited by examiner

*Primary Examiner*—Matthew Smith
*Assistant Examiner*—Walter Swanson
(74) *Attorney, Agent, or Firm*—McDermott Will & Emery LLP

(57) ABSTRACT

There is provided a method for manufacturing a vertically structured LED capable of performing a chip separation process with ease. In the method, a light-emitting structure is formed on a growth substrate having a plurality of device regions and at least one device isolation region, wherein the light-emitting structure has an n-type clad layer, an active layer and a p-type clad layer which are disposed on the growth substrate in sequence. A p-electrode is formed on the light-emitting structure. Thereafter, a first plating layer is formed on the p-electrode such that it connects the plurality of device isolation regions. A pattern of a second plating layer is formed on the first plating layer of the device region. The growth substrate is removed, and an n-electrode is then formed on the n-type clad layer.

25 Claims, 23 Drawing Sheets

(a)

(b)

METHOD FOR MANUFACTURING VERTICALLY STRUCTURED LIGHT EMITTING DIODE

RELATED APPLICATION

The present application is based on, and claims priority from, Korean Application Number 2005-93409, filed Oct. 5, 2005, the disclosure of which is hereby incorporated by reference herein in its entirety.

BACKGROUND OF THE INVENTION

1. Field of the Invention

The present invention relates to a method for manufacturing a semiconductor light emitting device, and more particularly, to a method for manufacturing a vertically structured light emitting diode (LED) capable of easily performing a chip separation process for individual elements.

2. Description of the Related Art

A gallium nitride (GaN)-based semiconductor, which is represented as $Al_xGa_yIn_{1-x-y}N$ ($0 \leq x \leq 1$, $0 \leq y \leq 1$, $0 \leq x+y \leq 1$), is a compound semiconductor material adaptive for light-emitting in ultraviolet region, and is used for a blue or green light emitting diode (LED). The GaN-based LED that is being used up to date is mainly classified into two types, of which one is a horizontally structured GaN-based LED and the other is a vertically structured GaN-based LED. In the horizontally structured GaN-based LED, both a p-electrode and an n-electrode are disposed at the same side of the device. Accordingly, the total area of the LED device should be great for securing a sufficient light-emitting area. In addition, since a transparent electrode and the n-electrode are close to each other, the horizontally structured GaN-based LED is vulnerable to electrostatic discharge (ESD).

On the contrary, the vertically structured GaN-based LED has several advantageous merits in comparison with the horizontally structured GaN-based LED. In the vertically structured GaN-based LED, the p-electrode and the n-electrode are disposed opposite to each other, wherein a GaN-based epitaxial layer is interposed therebetween.

Typically, the vertically structured GaN-based LED is manufactured through an attachment process of a conductive substrate (e.g., a silicon or a gallium arsenide (GaAs) substrate) and a removal process of a growth substrate (e.g., a sapphire substrate). Korean Patent Laid-Open Publication No. 2004-58479 discloses a method for manufacturing a vertically structured GaN-based LED including an attachment process of a Si substrate, a removal process of a sapphire substrate, and a dicing process of the Si substrate.

FIGS. 1A through 1F are cross-sectional views illustrating a conventional method for manufacturing a vertically structured GaN-based LED. To begin with, referring to FIG. 1A, an n-type clad layer 15a, an active layer 15b and a p-type clad layer 15c, which are formed of a GaN-based semiconductor, are sequentially formed on a sapphire substrate 11, to thereby form a light-emitting structure 15. Thereafter, referring to FIG. 1B, a trench 20 is formed so as to divide the light-emitting structures 15 into individual device regions, and a p-electrode 16 is then formed on the p-type clad layer 15c. Afterwards, referring to FIG. 1C, a conductive substrate 21 such as a Si substrate, a GaAs substrate, or the like is attached on the p-electrode 16 using a conductive adhesive layer 17 such as gold (Au) or the like. Subsequently, the sapphire substrate 11 is removed from the light-emitting structure 15 by means of laser lift-off process. In detail, a laser beam 18 is irradiated on the sapphire substrate 11 so that the sapphire substrate 11 is removed from the light-emitting structure 15. Accordingly, there is obtained the resultant structure where the sapphire substrate 11 is removed, as illustrated in FIG. 1D. Thereafter, referring to FIG. 1E, an n-electrode 19 is formed on the n-type clad layer 15a. Next, referring to FIG. 1F, the resultant structure of FIG. 1E is divided into individual elements through chip separation process, thereby obtaining a plurality of vertically structured GaN-based LEDs 10 simultaneously.

According to the conventional method, the process of cutting away the conductive substrate 21 should be performed for separating the chips from one another. In order to cut away the conductive substrate 21, a dicing process of cutting the conductive substrate 21 should be performed with a cutting wheel. Otherwise, a complicated process such as scribing and breaking process should be performed. Therefore, the manufacturing cost is increased and the total process time is delayed resultingly, due to this complicated process. In addition, in case of using the Si substrate or the GaAs substrate as the conductive substrate 21, the efficiency of heat release is poor and further the device characteristic is deteriorated when high current is applied thereto, because the thermal conductivity of the substrate 21 is not so good. Moreover, while attaching the conductive substrate on the light-emitting structure 15, a crack may occur in the light-emitting structure 15 so that the device may be damaged in the end. This problem may also occur in the manufacturing process of vertically structured LEDs using other compound semiconductors of group III-V, e.g., vertically structured AlGaInP-based LED, AlGaAs-based LED, or the like.

SUMMARY OF THE INVENTION

Accordingly, the present invention is directed to a method for manufacturing vertically structured light emitting diode that substantially obviates one or more problems due to limitations and disadvantages of the related art.

An object of the present invention is to provide a vertically structured light-emitting diode (LED) capable of easily performing a chip separation process and enhancing the efficiency of heat release.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

According to an aspect of the present invention, there is provided a method for manufacturing a vertically structured light-emitting diode (LED), including steps of: forming a light-emitting structure on a growth substrate having a plurality of device regions and at least one device isolation region, wherein the light-emitting structure includes an n-type clad layer, an active layer and a p-type clad layer which are disposed on the growth substrate in sequence; forming a p-electrode on the light-emitting structure; forming a first plating layer on the p-electrode to connect the plurality of device regions; forming a pattern of a second plating layer on the first plating layer of the device regions; and removing the growth substrate, and forming an n-electrode on the n-type clad layer.

According to another aspect of the present invention, the method further includes the step of, before the step of forming the first plating layer, forming a trench in an area of the light-emitting structure on the device isolation region, to separate the light-emitting structure into individual device regions.

According to further aspect of the present invention, the method further includes: after removing the growth substrate, forming a trench in an area of the light-emitting structure on the device isolation region, to separate the light-emitting structure into individual device regions.

Preferably, the method further includes: after forming the trench, forming a passivation layer on a side surface of the light-emitting structure divided into the individual device regions.

According to further aspect of the present invention, the method further includes: after forming the n-electrode, removing the first plating layer of the device isolation region by wet etching. Preferably, the first plating layer is formed of a metallic material different from that of the second plating layer, and the first plating layer has a higher etch selectivity than the second plating layer.

According to further aspect of the present invention, the method further includes: after forming the n-electrode, breaking away the first plating layer of the device isolation region.

According to further aspect of the present invention, the method further includes: after forming the n-electrode, cutting away the first plating layer of the device isolation region by irradiating a laser beam on the first plating layer formed over the device isolation region. By means of the laser cutting of the first plating layer, it is possible to easily perform the chip separation process into individual elements without additional dicing or scribing process.

The first plating layer may be formed of at least one metallic material selected from the group consisting of Au, Cu, Ni, Ag, Cr, W, Al, Pt, Sn, Pb, Fe, Ti, Mo, and a combination thereof. The second plating layer may be formed of at least one metallic material selected from the group consisting of Au, Cu, Ni, Ag, Cr, W, Al, Pt, Sn, Pb, Fe, Ti, Mo, and a combination thereof.

According to further aspect of the present invention, the first plating layer is coated on the entire surface including the top surface of the p-electrode. Alternatively, the first plating layer is formed such that it opens a portion of the device isolation region.

According to further aspect of the present invention, the step of forming the first plating layer comprises: forming 'a seed layer for plating' on the p-electrode such that it connects the plurality of device regions; and performing an electroplating on the seed layer. The seed layer may be formed by an electroless plating or deposition process.

According to further aspect of the present invention, the step of forming the pattern of the second plating layer includes: forming a photoresist pattern which opens the first plating layer of the device region; and selectively performing the electroplating on the first plating layer of the device region, using the photoresist pattern.

The step of removing the growth substrate is performed by physical, chemical, or mechanical method. The first plating layer is used as a kind of a supporting member when removing the growth substrate. The growth substrate, for example, may be performed by a laser lift-off (LLO) process or a chemical lift-off (CLO) process. In particular, in case that the growth substrate is removed by the CLO process, the first plating layer may be formed such that it opens a portion of the device isolation layer.

The n-type clad layer, the active layer and the p-type clad layer may be formed of a compound semiconductor material of group III-V. In this case, the growth substrate may be an insulating substrate such as a sapphire substrate or a conductive substrate.

According to even another embodiment of the present invention, the n-type clad layer, the active layer and the p-type clad layer are formed of a semiconductor material represented as $Al_xGa_yIn_{1-x-y}N$ ($0 \leq x \leq 1$, $0 \leq y \leq 1$, $0 \leq x+y \leq 1$). In this case, a sapphire substrate may be used as the growth substrate.

According to even yet another embodiment of the present invention, the n-type clad layer, the active layer and the p-type clad layer are formed of a semiconductor material represented as $Al_xGa_yIn_{1-x-y}P$ ($0 \leq x \leq 1$, $0 \leq y \leq 1$, $0 \leq x+y \leq 1$). Alternatively, the n-type clad layer, the active layer and the p-type clad layer are formed of a semiconductor material represented as $Al_xGa_{1-x}As$ ($0 \leq x \leq 1$).

According to the present invention, it is possible to easily perform the chip separation process by selectively wet-etching, breaking or laser-cutting the first plating layer of the device isolation region without an additional dicing process or scribing process. Accordingly, it is possible to reduce the manufacturing cost and process time. In addition, since a supporting substrate is formed through a plating process, it is possible to prevent the problem that the crack occurs when attaching the conductive substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
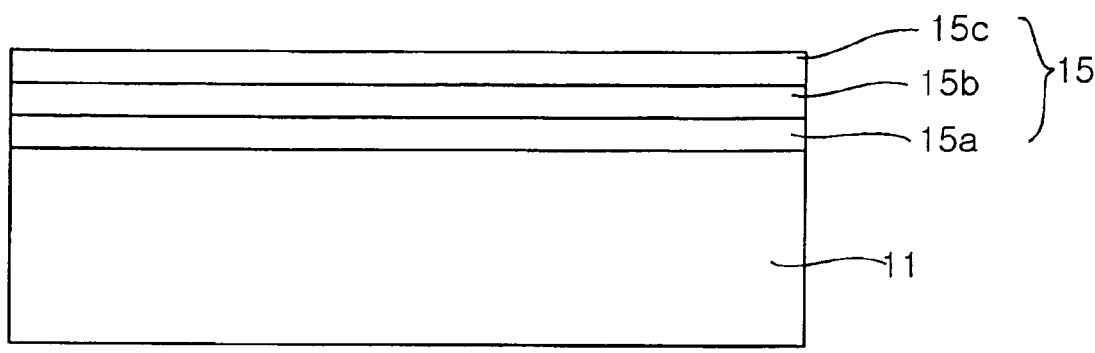
FIGS. 1A to 1F are cross-sectional views illustrating a conventional method for manufacturing a vertically structured light-emitting diode (LED)
Figure 1B:
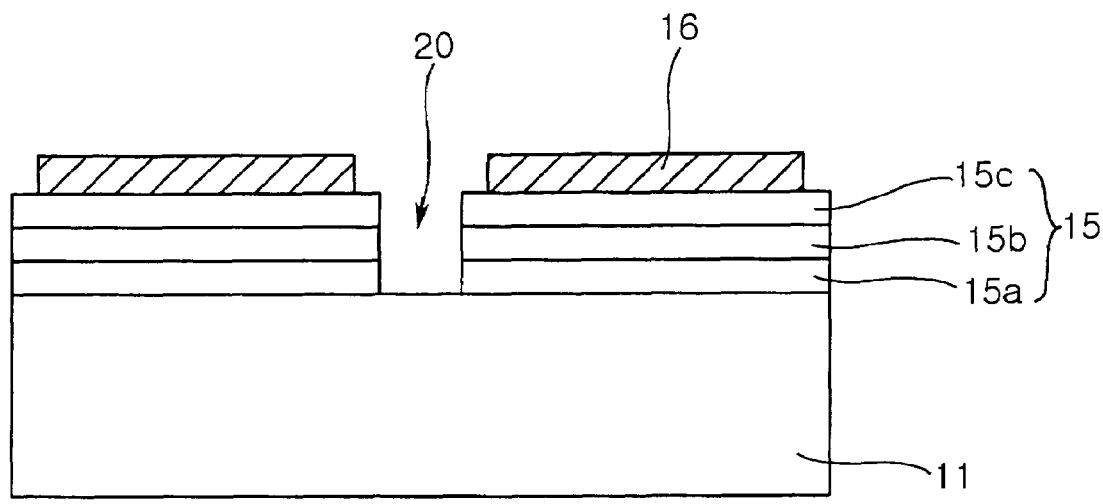
Figure 1C:
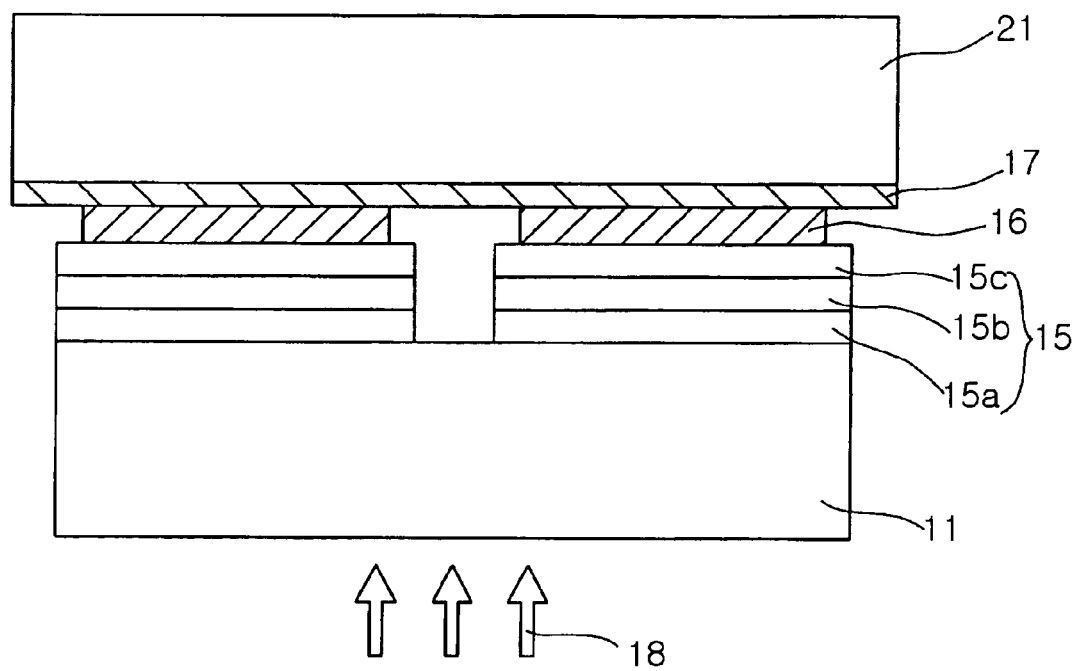
Figure 1D:
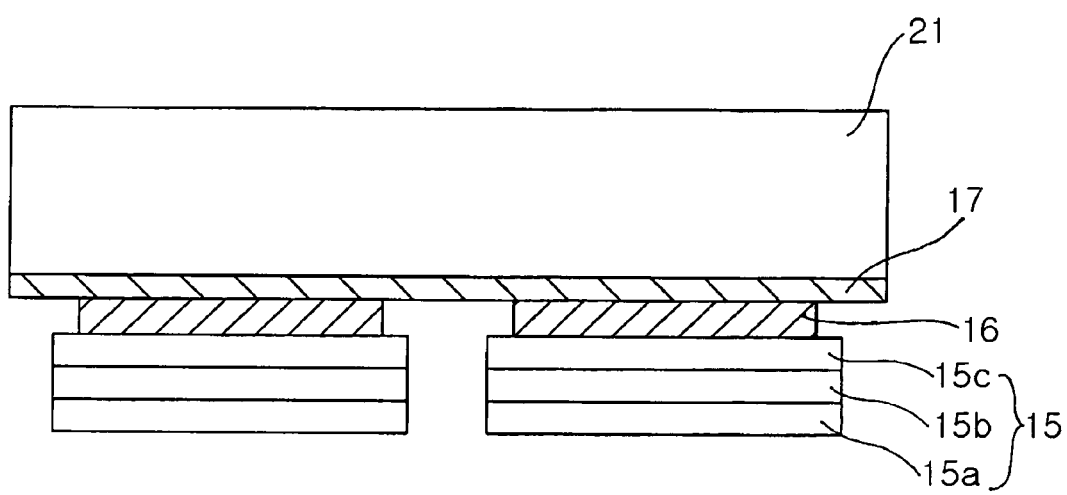
Figure 1E:
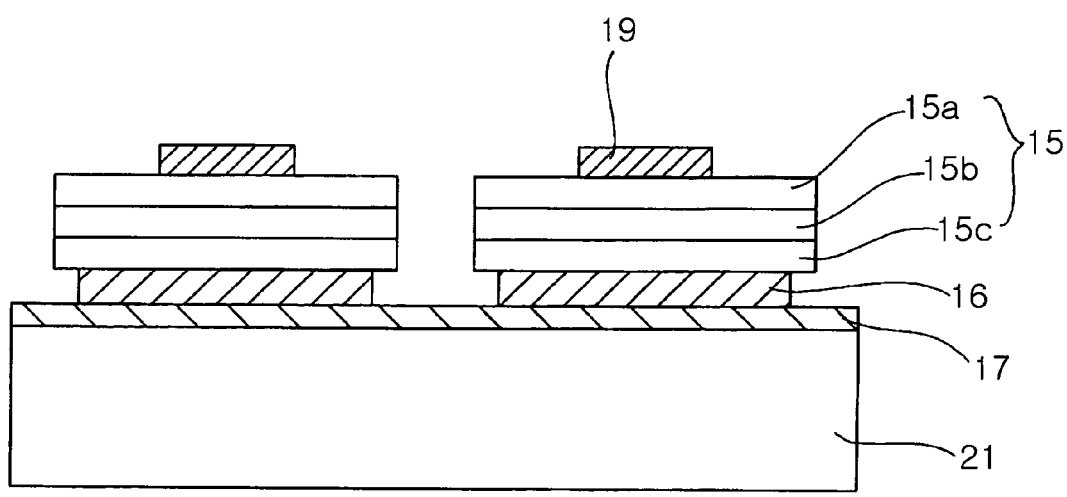
Figure 1F:
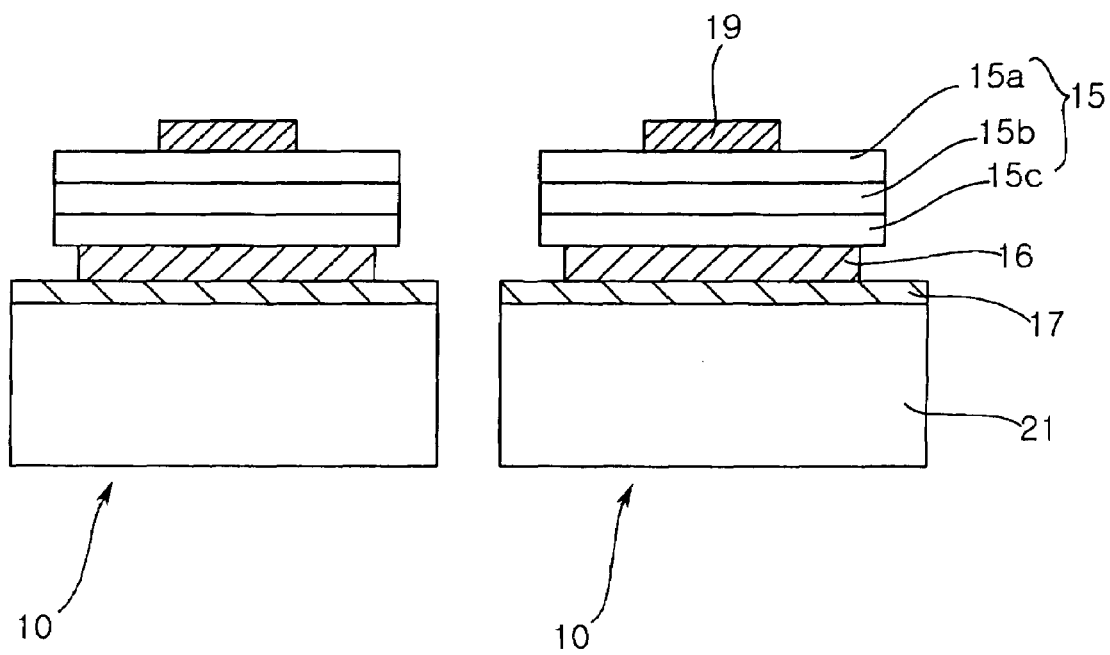

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shapes and sizes of elements may be exaggerated for clarity, and like reference numerals in the drawings denote like elements.

FIGS. 2 to 11 are cross-sectional views illustrating a method for manufacturing a vertically structured light-emitting diode (LED) according to one embodiment of the present invention. In order to manufacture the LED, a sapphire substrate is used as a growth substrate, and a gallium nitride (GaN)-based semiconductor represented as $Al_xGa_yIn_{1-x-y}N$ ($0 \leq x \leq 1$, $0 \leq y \leq 1$, $0 \leq x+y \leq 1$) is used as a light-emitting structure.

Figure 2:
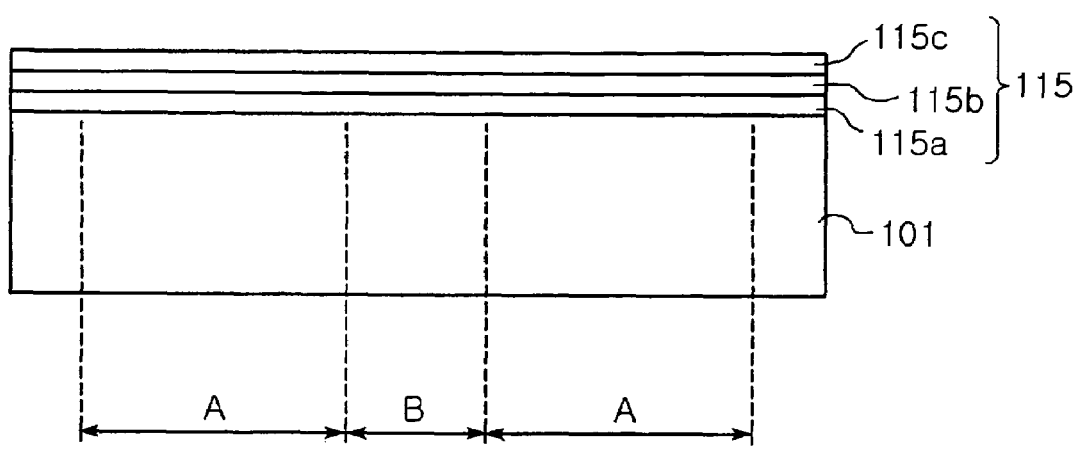
FIGS. 2 to 11 are cross-sectional views illustrating a method for manufacturing a vertically structured LED according to one embodiment of the present invention.

First, referring to FIG. 2, an n-type clad layer 115a, an active layer 115b and a p-type clad layer 115c are sequentially formed on a sapphire substrate 101, so as to obtain a light-emitting structure 115 on the sapphire substrate 101. The sapphire substrate 101 on which the light-emitting structure 115 is formed includes a plurality of device regions A and at least one device isolation region B. The device region A is correspondent to a region where an LED chip will be formed, and the device isolation region B is correspondent to a boundary region between the LED chips.

Figure 3:
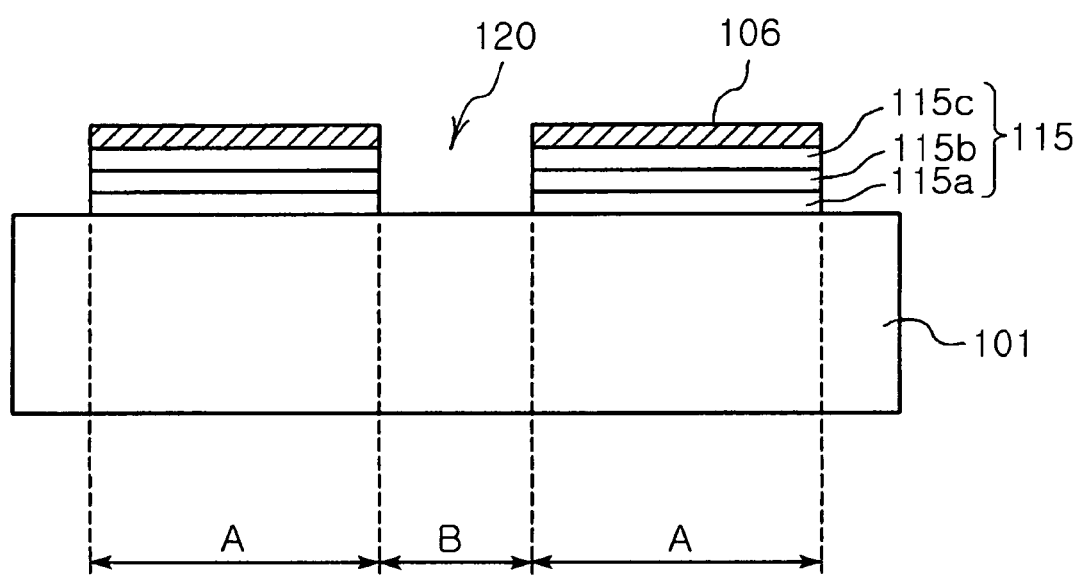

Thereafter, referring to FIG. 3, the light-emitting structure 115 of the device isolation region B is removed, to thereby form a device isolation trench 120. Accordingly, the light-emitting structure 115 is divided into individual device regions A. Afterwards, a p-electrode 106 is formed on the p-type clad layer 115c. The p-electrode 106, for example, may include a Pt/Au layer, a Ni/Au layer, or a Ni/Ag/Pt layer. This p-electrode 106 is in ohmic contact with the p-type clad layer 115c.

Alternatively, the processes of forming the device isolation trench 120 and the p-electrode 106 may be performed in a different sequence. In order words, the p-electrode 106 may be formed on the p-type clad layer 115c first. Thereafter, the device isolation trench 120 may be formed in the device isolation region B to divide the light-emitting structure 115 into individual device regions A.

Figure 4:
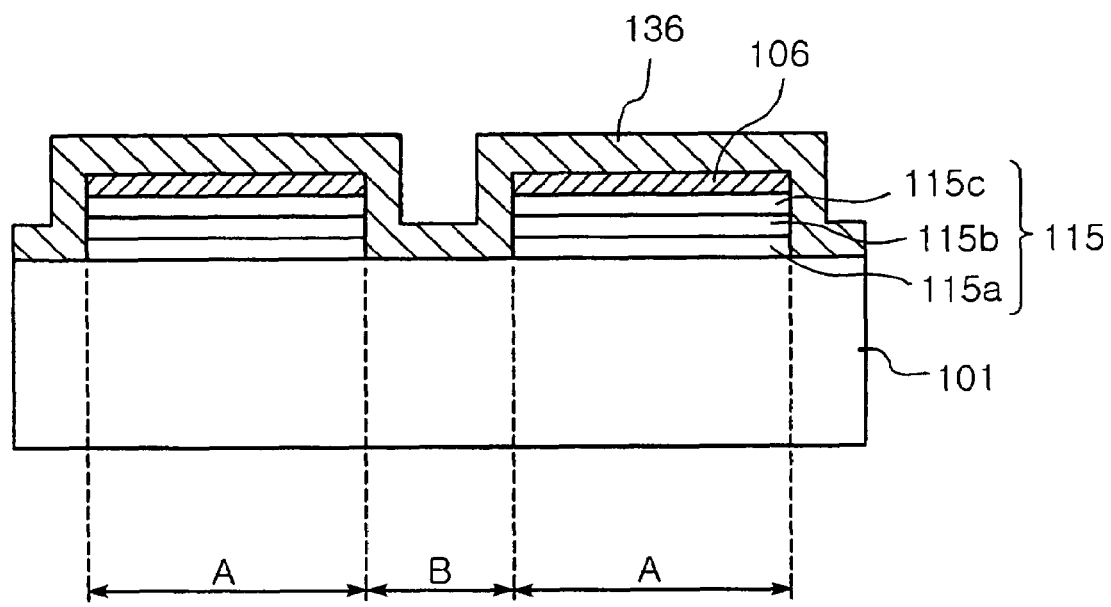

Afterwards, referring to FIG. 4, a first plating layer 136 is formed on the p-electrode 106 and the device isolation region B such that it connects the plurality of device regions A. In order to form the first plating layer 136, 'a seed layer for plating' (not shown) is formed on both the top surface of the p-electrode 106 and the device isolation region B in advance such that the it connects the plurality of device regions A. The seed layer, for example, may be easily formed by electroless plating or deposition process such as sputtering or the like. Thereafter, an electroplating is performed so that a metal is coated on the seed layer. As a result, the first plating layer 136 is obtained. The first plating layer 136, for example, may be formed of at least one metallic material selected from the group consisting of Au, Cu, Ni, Ag, Cr, W, Al, Pt, Sn, Pb, Fe, Ti, Mo, and a combination thereof.

As it will be illustrated more fully in followings, the first plating layer 136 acts as a supporting member when removing the sapphire substrate 101. For this reason, the first plating layer 136 should be formed such that it can connect the plurality of device isolation regions A. For instance, the first plating layer 136 may be formed such that it is coated on the entire surface, i.e., the entire surface of the resultant structure of FIG. 3, incorporating the top surface of the p-electrode 106. However, the first plating layer 136 may not be necessarily coated on the entire surface. Variable coating types of the first plating layer 136 may be more fully illustrated with reference to FIGS. 12A and 12B.

Figure 12:
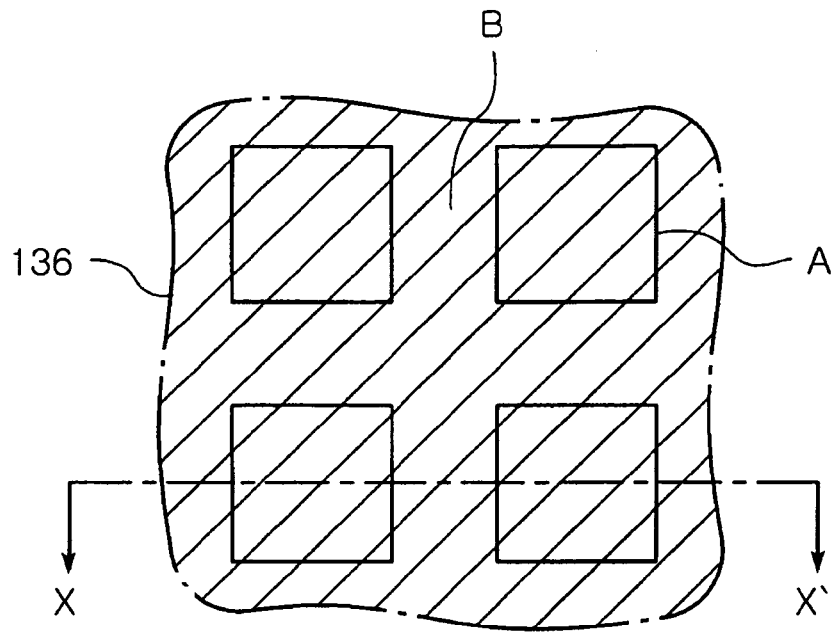
FIG. 12 is a plane view illustrating a first plating layer formed on the structure of FIG. 4.
Figure 12:
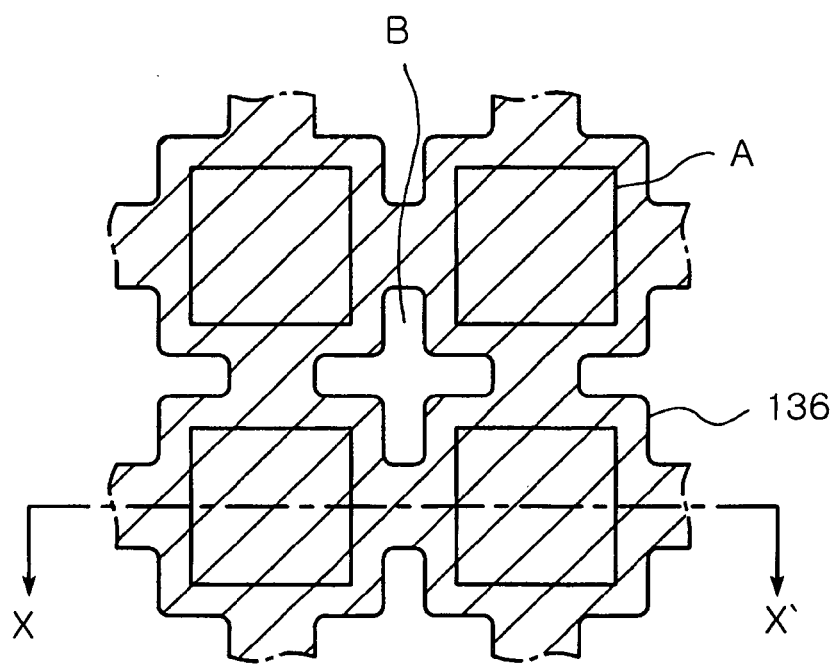
Figure 13:
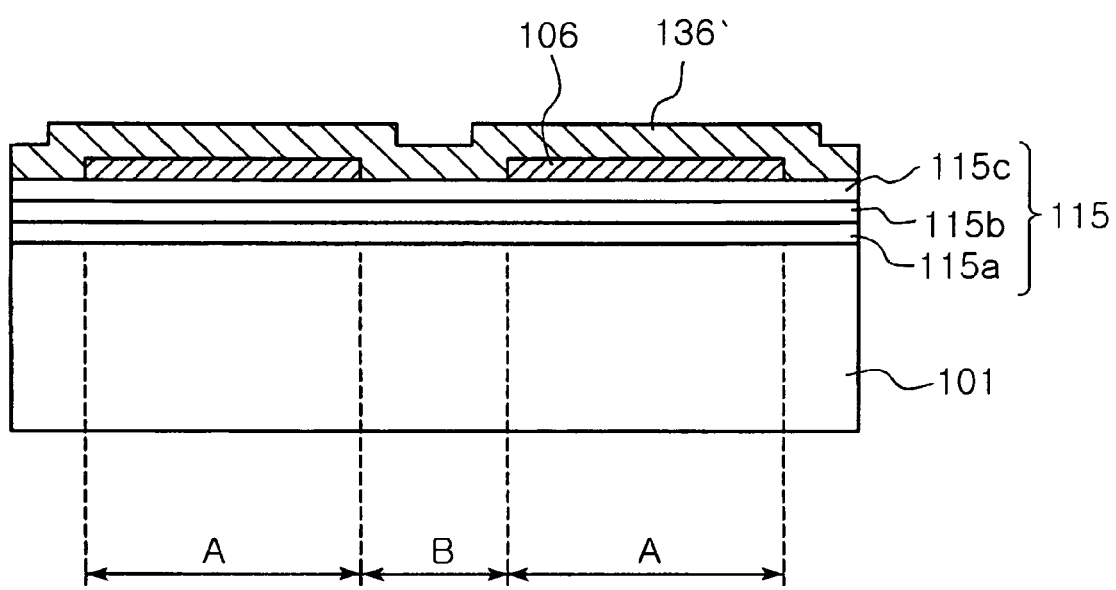
FIGS. 13 to 18 are cross-sectional views illustrating a method for manufacturing a vertically structured LED according to another embodiment of the present invention.

FIG. 12(a) and 12(b) are schematic plane views illustrating examples of the coating type of the first plating layer 136. FIG. 4 is a cross-sectional view taken along a line X-X' of FIG. 12(a) or 12(b). First, referring to FIG. 12(a), the first plating layer 136 may be coated on the entire surface including all the device regions A and the device isolation region B.

Alternatively, the first plating layer 136 may be coated such that it opens a portion of the device isolation region B. That is, referring to FIG. 12(b), the first plating layer 136 may not be coated on a predetermined portion of the device isolation region B. In particular, in case of removing the substrate 101 using a chemical lift-off process, it is preferable to form the first plating layer 136 such that it opens the predetermined portion of the device isolation region B as illustrated in FIG. 12(b).

Figure 5:
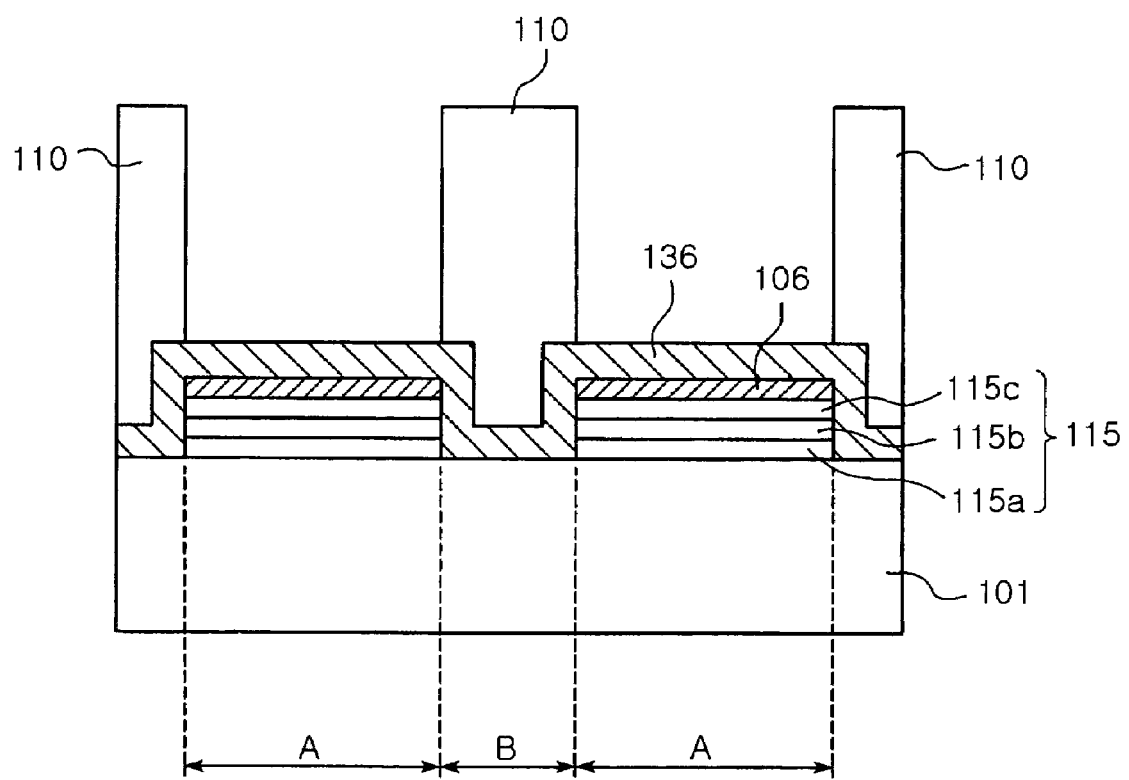

Subsequently, referring to FIG. 5, a photoresist pattern 110 is formed to open the first plating layer 136 of the device region A. The photoresist pattern 110 may be formed by photoresist-coating, exposure and development processes.

Figure 6:
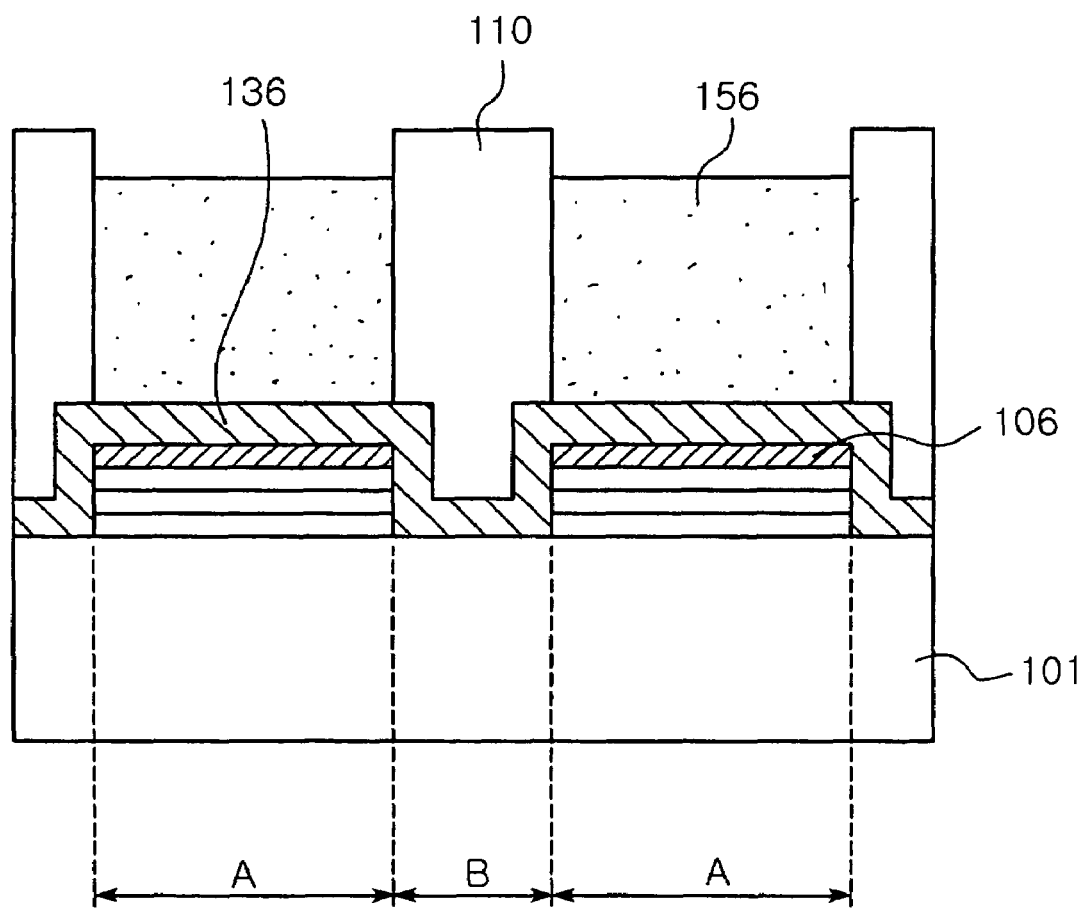
Figure 7:
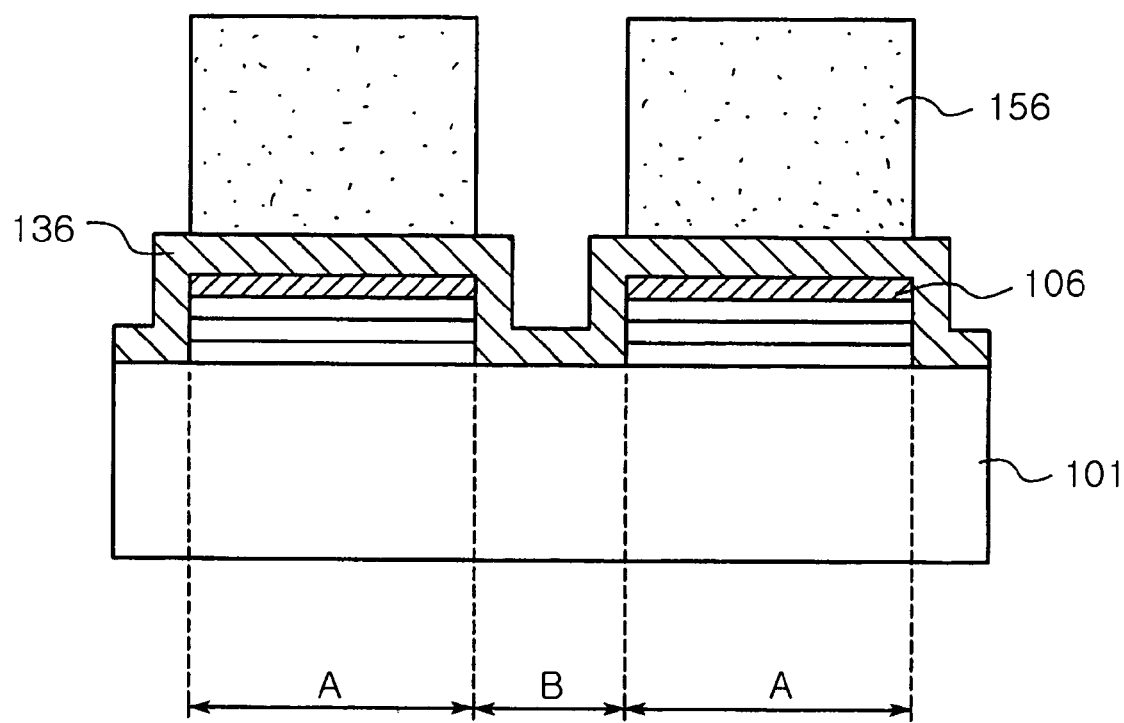

Thereafter, referring to FIG. 6, the electroplating is selectively performed on only the p-electrode 106 of the device isolation region A using the photoresist pattern 110, to thereby form a second conductive layer 156 between the photoresist patterns 110. The second conductive layer 156, for example, may be formed of at least one metallic material selected from the group consisting of Au, Cu, Ni, Ag, Cr, W, Al, Pt, Sn, Pb, Fe, Ti, Mo, and a combination thereof. Although FIG. 6 illustrates that the second conductive layer 156 is formed as a mono-layer, it may be formed as a multi-layer. After forming the second plating layer 156, referring to FIG. 7, the photoresist pattern 110 is removed using a stripping solution.

Figure 8:
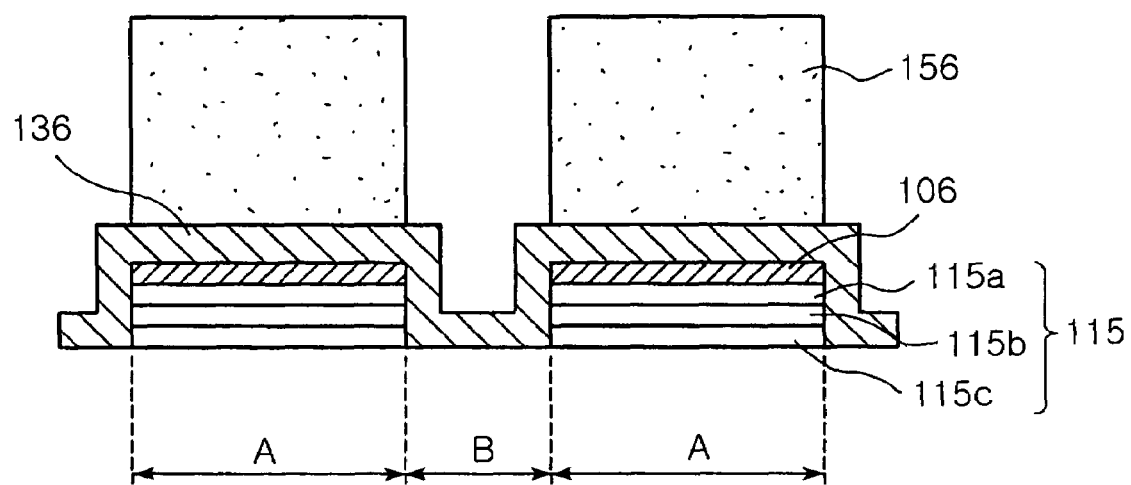

Next, referring to FIG. 8, the sapphire substrate is separated or removed from the light-emitting structure 115 using physical, chemical or mechanical method. At this time, the first and second plating layers 136 and 156 act as a supporting substrate. The sapphire substrate for example, may be removed by means of mechanical or chemical mechanical polishing such as laser lift-off (LLO), chemical lift-off (CLO), chemical etching, grounding/lapping, or the like.

In particular, if removing the substrate growth by means of the CLO process, it is preferable to form the first plating layer 136 such that it opens a portion of the device isolation region B, as illustrated in FIG. 12(b). The reason is that chemicals for use in removing the growth substrate may easily penetrate into an interface between the light-emitting structure 115 and the sapphire substrate through the opened portion of the device isolation region B.

Figure 9:
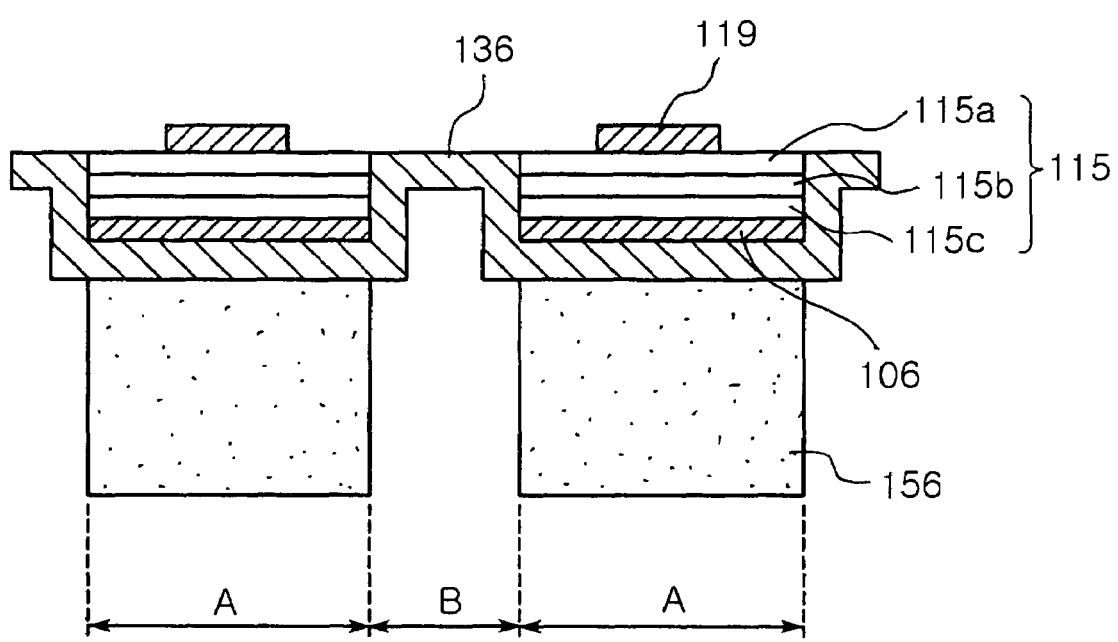

Afterwards, referring to FIG. 9, an n-electrode 119 is formed on the exposed n-type clad layer 115a from which the sapphire substrate is removed. It is noticed that FIG. 9 is an upside-down view in comparison with the structure of FIG. 8. Preferably, before forming the n-electrode 119, the top surface of the n-type clad layer 115a exposed by the removal of the sapphire substrate may be rinsed and etched.

Figure 10:
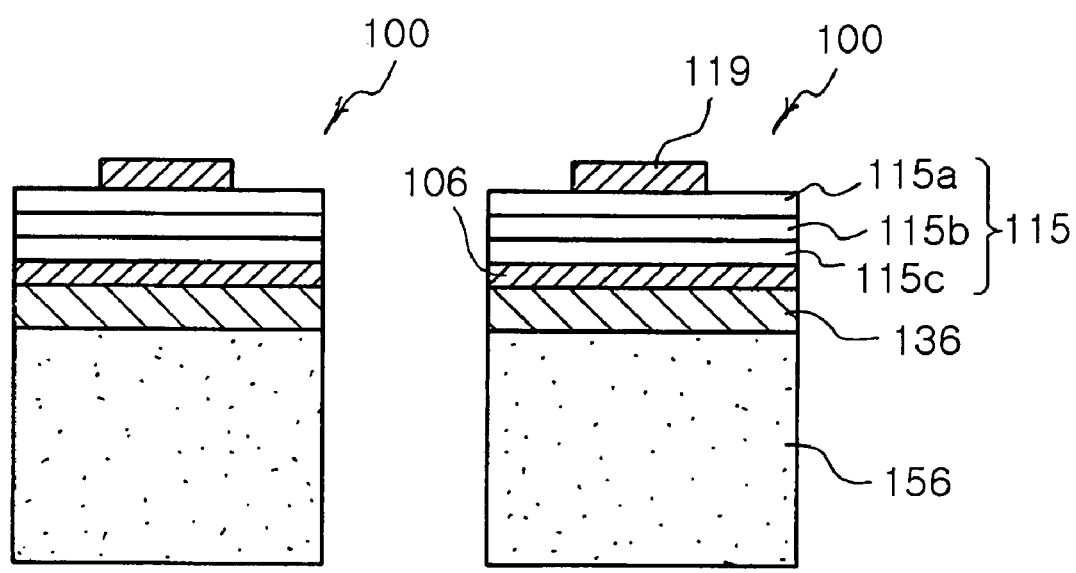

Thereafter, referring to FIG. 10, the first plating layer 136 of the device isolation region B is removed through wet etching process. Preferably, the first plating layer 136 may be formed of a material different from that of the second plating layer 156. In particular, the first plating layer 136 may be formed of a material having a higher etch selectivity than the second plating layer 156. Therefore, the second plating layer 156 is hardly etched while etching the first plating layer 136, because the etch selectivity of the first plating layer 136 is higher than that of the second plating layer 156. Resultingly, it is possible to obtain the plurality of vertically structured LEDs 100 which are divided into individual elements.

Figure 11:
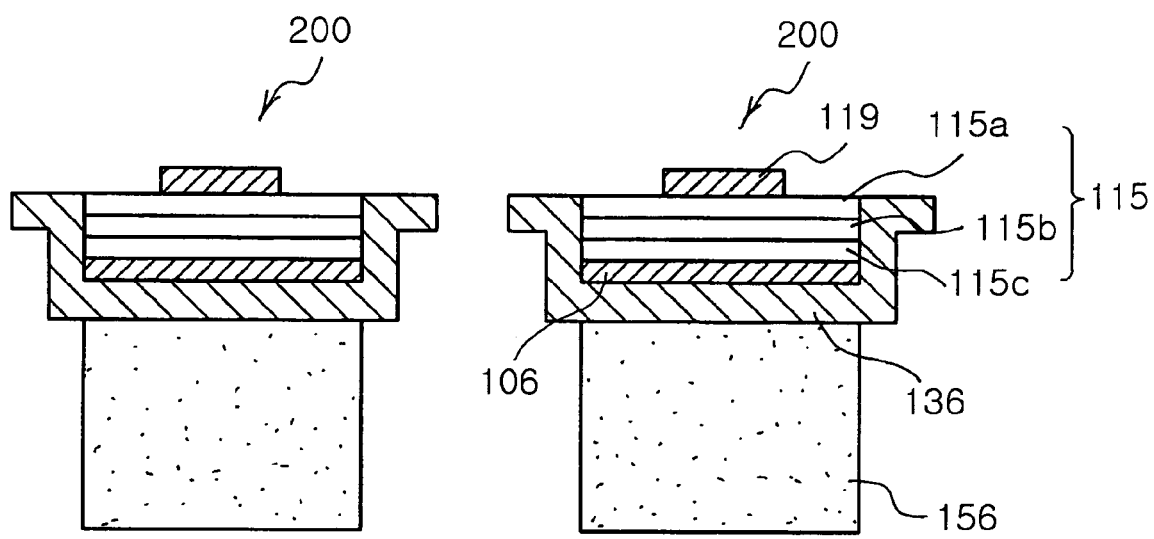

Alternatively, it is possible to obtain the plurality of vertically structured LEDs from the structure of FIG. 9 using a breaking or laser-cutting process instead of the etching process. That is, the first plating layer 136 of the device isolation region B is broken away or irradiated with laser beam after obtaining the structure of FIG. 9 so that the first plating layer 136 may be cut away from the device isolation region B. Therefore, it is possible to obtain a plurality of vertically structured LEDs 200 which are divided into individual elements, as illustrated in FIG. 11.

As described above, according to the embodiment of the present invention, it is possible to easily obtain the plurality of vertically structured LEDs 100 and 200 which are divided into individual elements through the wet etching, breaking and laser-cutting of the first plating layer 136, without an additional dicing process or scribing process. Thus, it is possible to prevent the increase of the manufacturing cost and process time owing to the dicing process or the like. In addition, since the present invention employs the plating process instead of the attachment process of the conductive substrate, there is no danger of crack which may occur due to the attachment process of the substrate. Furthermore, because the metallic material, i.e., the second conductive layer 156, formed through the plating process is used as the conductive substrate of the individual LEDs 100 and 200, the LED of the present invention shows excellent effect of heat release.

In the aforementioned embodiments, the trench 120 is formed before removing the sapphire substrate 101. However, the present invention is not limited to this. That is, the sapphire substrate 101 may be removed in advance, and thereafter, the device isolation trench 120 may be formed.

FIGS. 13 to 18 are cross-sectional views illustrating a method for manufacturing a vertically structured LED according to another embodiment of the present invention. In another embodiment of the present invention, the device isolation trench 120 is formed after the removal of the sapphire substrate 101.

To being with, as already described above with reference to FIG. 2, a light-emitting structure 115 is formed on the sapphire substrate 101. Thereafter, referring to FIG. 13, the p-electrode 106 is formed on the light-emitting structure 115, and a first plating layer 136' is formed thereon.

Figure 14:
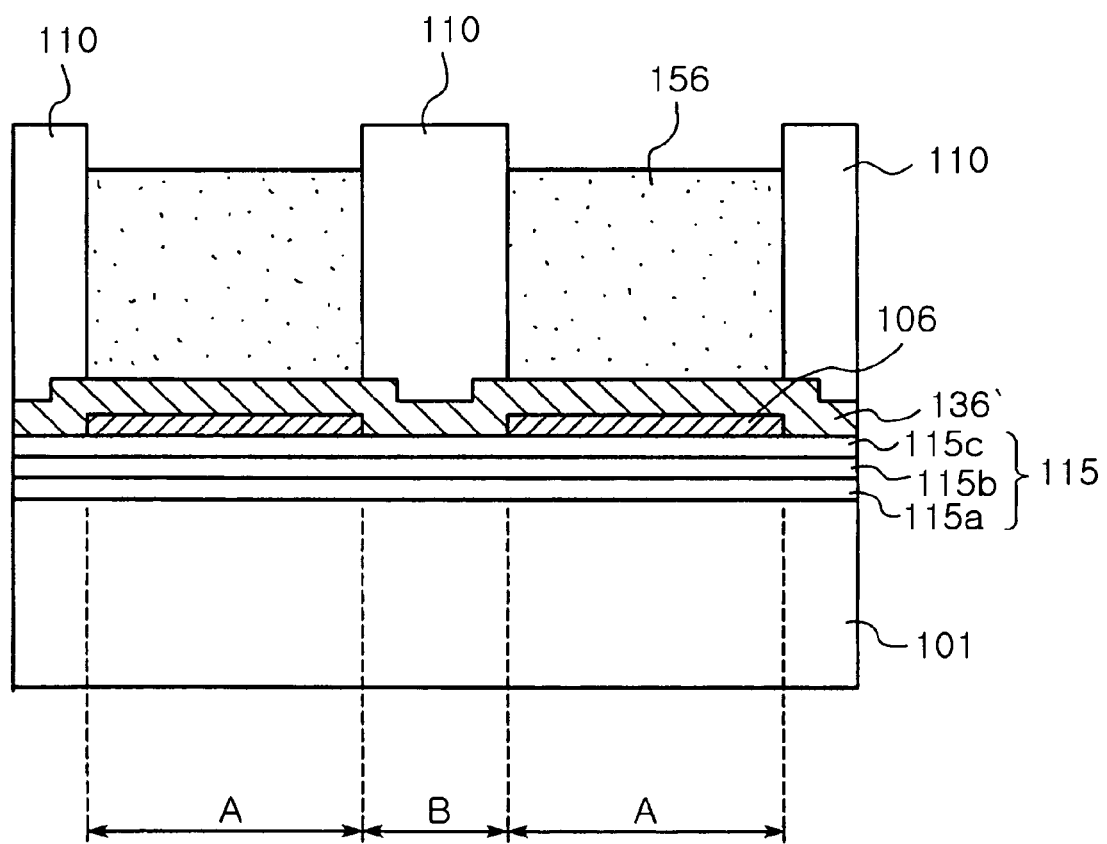
Figure 15:
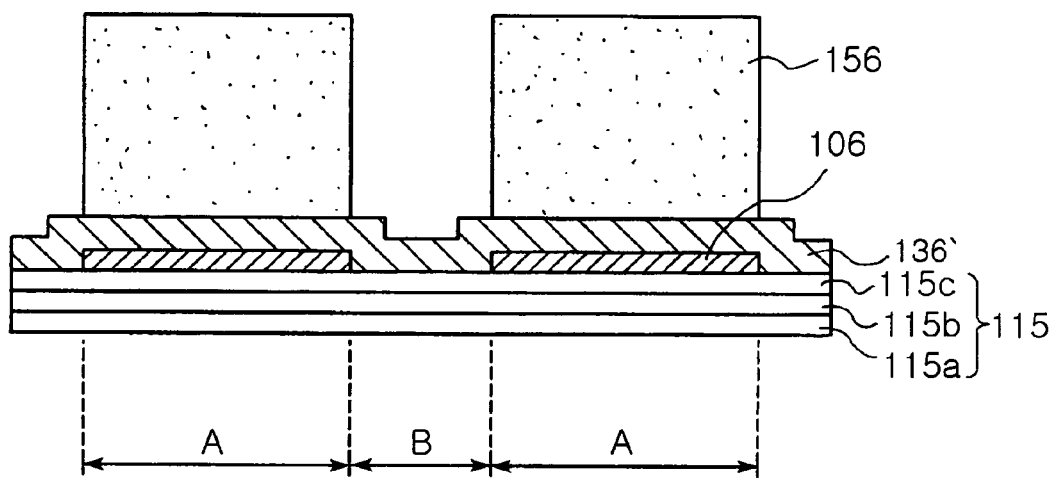

Afterwards, referring to FIG. 14, a photoresist pattern 110 is formed to open the first plating layer 136' of the device region A. Then, a second plating layer 156 is formed using the photoresist pattern 110. Subsequently, referring to FIG. 15, the photoresist pattern 110 is removed, and then the sapphire substrate is removed using the laser lift-off process, etc.

Figure 16:
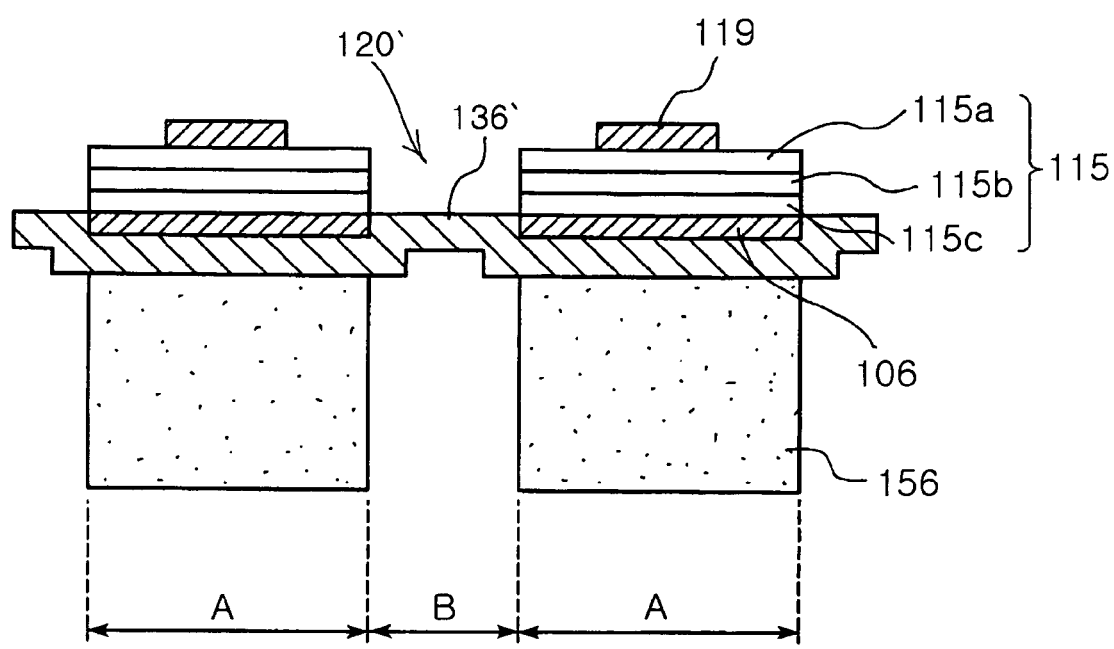

After removing the sapphire substrate, referring to FIG. 16, the light-emitting structure 115 of the device isolation region B is removed so as to form a device isolation trench 120', and thereafter, an n-electrode 119 is formed on the n-type clad layer 115*a*.

Figure 17:
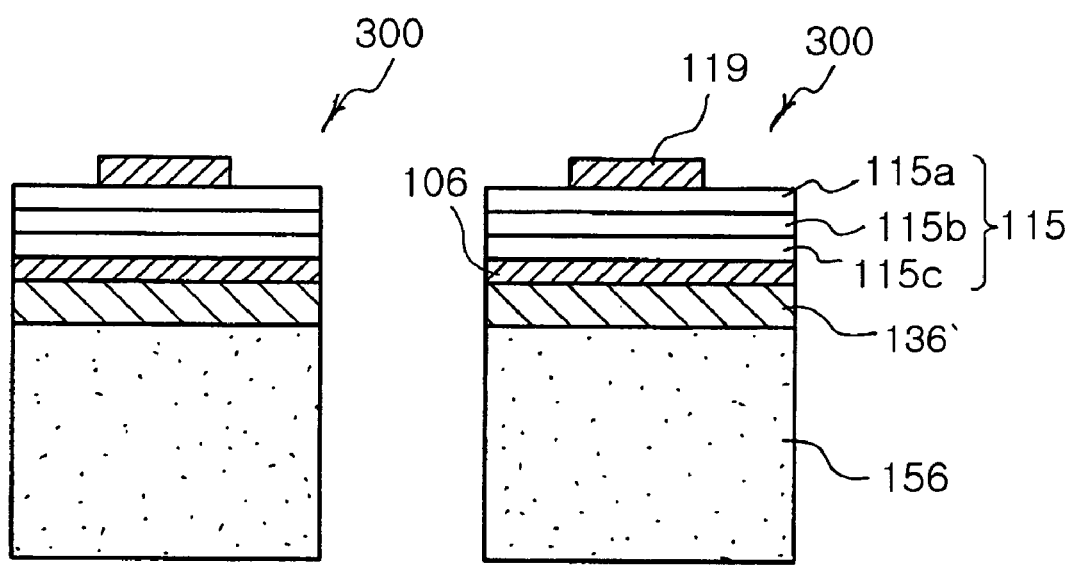
Figure 18:
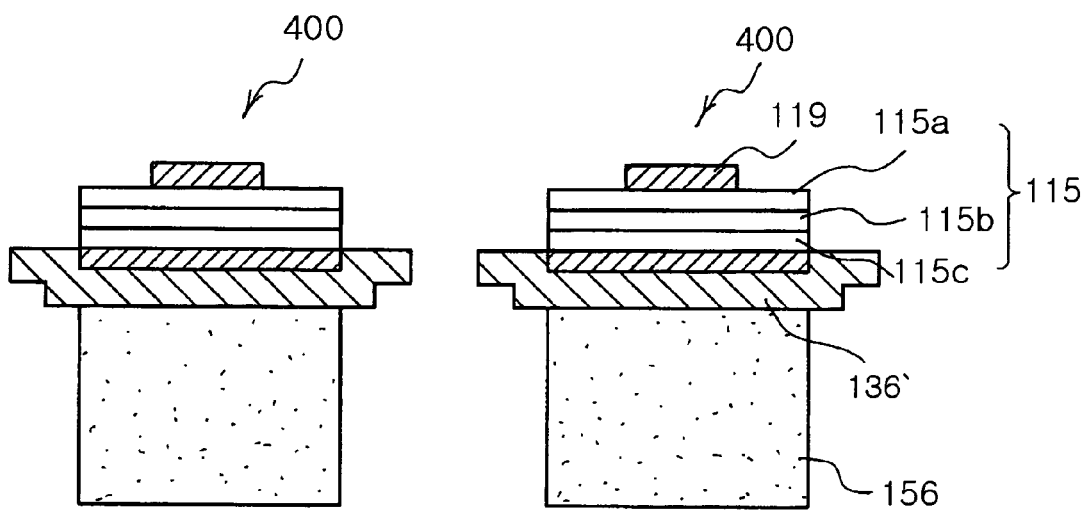

Thereafter, the first plating layer 136' of the device isolation region B is removed through the wet etching process so that the resultant structure is divided into individual light-emitting elements (see FIG. 17). Therefore, a plurality of vertically structured LEDs 300 are obtained. Alternatively, a plurality of vertically structured LEDs 400 may be formed through the breaking and laser-cutting of the first plating layer 136' instead of the wet etching (see FIG. 18).

According to this embodiment of the present invention, it is also possible to easily perform the chip separation process by breaking away or wet-etching the first plating layer 136', without an additional dicing process or scribing process.

Although it is not illustrated in the aforementioned embodiments, a passivation layer (not shown) may be formed on the side surface of the exposed light-emitting structure 115 after forming the trenches 120 and 120'. The passivation layer plays a role in protecting the light-emitting structure 115, and preventing the leakage current owing to the undesired short between the semiconductor layers 115*a*, 115*b* and 115*c* as well.

In the aforementioned embodiments, although the sapphire substrate 101 is used as the growth substrate and the semiconductor material of $Al_xGa_yIn_{1-x-y}N$ ($0 \leq x \leq 1$, $0 \leq y \leq 1$, $0 \leq x+y \leq 1$) is used as the light-emitting structure, the present invention is not limited to this. That is, the present invention may be applied to other compound semiconductors of group III-V.

For instance, according to another embodiment of the present invention, a GaAs substrate may be used as the growth substrate instead of the sapphire substrate 101 and a semiconductor material of $Al_xGa_yIn_{1-x-y}P$ ($0 \leq x \leq 1$, $0 \leq y \leq 1$, $0 \leq x+y \leq 1$) may be used as the light-emitting structure 115. As a still another embodiment, the GaAs substrate may be used as the substrate instead of the sapphire substrate 101, and the semiconductor material of $Al_xGa_{1-x}As$ ($0 \leq x \leq 1$) may be used as the light-emitting structure 115.

As described above, according to the present invention, it is possible to easily perform the chip separation process by wet-etching, breaking and laser-cutting the first plating layer without an additional dicing or scribing process. Accordingly, it is possible to prevent the increase of the manufacturing cost and process time owing to the dicing process or the like. In addition, since the present invention employs the plating process instead of the attachment process of the conductive substrate, there is no danger of the crack which may occur due to the attachment process of the substrate. Furthermore, because the metallic material formed by the plating process is used as the conductive substrate of the individual LED, the LED manufactured by the inventive method shows the excellent effect of heat release.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a vertically structured light-emitting diode (LED), the method comprising steps of:

forming a light-emitting structure on a growth substrate having a plurality of device regions and at least one device isolation region, wherein the light-emitting structure includes an n-type clad layer, an active layer and a p-type clad layer which are disposed on the growth substrate in sequence;

forming a p-electrode on the light-emitting structure;

forming a first plating layer on the p-electrode to connect the plurality of device regions;

forming a pattern of a second plating layer on the first plating layer of the device regions, the pattern defining each of the device regions;

removing the growth substrate; and forming an n-electrode on the n-type clad layer.

2. The method of claim 1, further comprising: before forming the first plating layer, forming a trench in an area of the light-emitting structure on the device isolation region, to separate the light-emitting structure into individual device regions.

3. The method of claim 1, further comprising: after removing the growth substrate, forming a trench in an area of the light-emitting structure on the device isolation region, to separate the light-emitting structure into individual device regions.

4. The method of claim 2, further comprising: after forming the trench, forming a passivation layer on a side surface of the light-emitting structure divided into the individual device regions.

5. The method of claim 3, further comprising: after forming the trench, forming a passivation layer on a side surface of the light-emitting structure divided into the individual device regions.

6. The method of claim 1, further comprising: after forming the n-electrode, removing the first plating layer of the device isolation region by wet etching.

7. The method of claim 6, wherein the first plating layer is formed of a metallic material different from that of the second plating layer, and the first plating layer has a higher etch selectivity than the second plating layer.

8. The method of claim 1, further comprising: after forming the n-electrode, breaking away the first plating layer of the device isolation region.

9. The method of claim 1, further comprising: after forming the n-electrode, cutting away the first plating layer of the device isolation region by irradiating a laser beam on the first plating layer formed over the device isolation region.

10. The method of claim 1, wherein the first plating layer is formed of at least one metallic material selected from the group consisting of Au, Cu, Ni, Ag, Cr, W, Al, Pt, Sn, Pb, Fe, Ti, Mo, and a combination thereof.

11. The method of claim 1, wherein the second plating layer is formed of at least one metallic material selected from the group consisting of Au, Cu, Ni, Ag, Cr, W, Al, Pt, Sn, Pb, Fe, Ti, Mo, and a combination thereof.

12. The method of claim 1, wherein the first plating layer is coated on the entire surface including the top surface of the p-electrode.

13. The method of claim 1, wherein the first plating layer is formed such that it opens a portion of the device isolation region.

14. The method of claim 1, wherein the step of forming the first plating layer comprises:
    forming a seed layer for plating on the p-electrode such that it connects the plurality of device regions; and
    performing an electroplating on the seed layer.

15. The method of claim 14, wherein the seed layer is formed by an electroless plating or deposition process.

16. The method of claim 1, wherein the step of forming the pattern of the second plating layer comprises:
    forming a photoresist pattern which opens the first plating layer of the device region; and
    selectively performing the electroplating on the first plating layer of the device region, using the photoresist pattern.

17. The method of claim 1, wherein the step of removing the growth substrate is performed by physical, chemical, or mechanical method.

18. The method of claim 17, wherein the step of removing the growth substrate is performed by a laser lift-off process.

19. The method of claim 17, wherein the step of removing the growth substrate is performed by a chemical lift-off process.

20. The method of claim 19, wherein the first plating layer is formed such that it opens a portion of the device isolation region.

21. The method of claim 1, wherein the n-type clad layer, the active layer and the p-type clad layer are formed of a compound semiconductor material of group III-IV.

22. The method of claim 1, wherein the n-type clad layer, the active layer and the p-type clad layer are formed of a semiconductor material represented as $Al_xGa_yIn_{1-x-y}N$ ($0 \leq x \leq 1$, $0 \leq y \leq 1$, $0 \leq x+y \leq 1$).

23. The method of claim 22, wherein the growth substrate includes a sapphire substrate.

24. The method of claim 1, wherein the n-type clad layer, the active layer and the p-type clad layer are formed of a semiconductor material represented as $Al_xGa_yIn_{1-x-y}P$ ($0 \leq x \leq 1$, $0 \leq y \leq 1$, $0 \leq x+y \leq 1$).

25. The method of claim 1, wherein the n-type clad layer, the active layer and the p-type clad layer are formed of a semiconductor material represented as $Al_xGa_{1-x}As$ ($0 \leq x \leq 1$).

* * * * *